United States Patent
Grayzel

(10) Patent No.: US 9,543,895 B2
(45) Date of Patent: Jan. 10, 2017

(54) CIRCUIT CONFIGURATION USING A FREQUENCY CONVERTER TO ACHIEVE TUNABLE CIRCUIT COMPONENTS SUCH AS FILTERS AND AMPLIFIERS

(71) Applicant: Alfred Grayzel, Park City, UT (US)

(72) Inventor: Alfred Grayzel, Park City, UT (US)

(*) Notice: Subject to any disclaimer, the term of this patent is extended or adjusted under 35 U.S.C. 154(b) by 0 days.

(21) Appl. No.: 14/428,118

(22) PCT Filed: Mar. 13, 2013

(86) PCT No.: PCT/US2013/032181
§ 371 (c)(1),
(2) Date: Mar. 13, 2015

(87) PCT Pub. No.: WO2014/042689
PCT Pub. Date: Mar. 20, 2014

(65) Prior Publication Data
US 2015/0236647 A1 Aug. 20, 2015

Related U.S. Application Data

(60) Provisional application No. 61/743,947, filed on Sep. 13, 2012.

(51) Int. Cl.
*G06G 7/12* (2006.01)
*H03D 7/04* (2006.01)
(Continued)

(52) U.S. Cl.
CPC .............. *H03D 7/04* (2013.01); *H03H 7/0153* (2013.01); *H03H 11/1291* (2013.01)

(58) Field of Classification Search
CPC .... H04B 1/045; H04B 1/22; H04B 2001/0491
(Continued)

(56) References Cited

U.S. PATENT DOCUMENTS 3,588,727 A 6/1971 Seidel
4,776,039 A 10/1988 Akaiwa
(Continued)

FOREIGN PATENT DOCUMENTS

JP 05240942 A 9/1993
RU 82389 U1 4/2009
(Continued)

OTHER PUBLICATIONS

Manley, et al., Some General Properties of Nonlinear Elements Part I General Energy Relations, Proceedings of the IRE, Jul. 1956, pp. 904-913, 44.
(Continued)

*Primary Examiner* — Dinh T Le
(74) *Attorney, Agent, or Firm* — Browdy and Neimark, PLLC

(57) ABSTRACT

A frequency converting circuit including: an impedance network having a first pair of terminals and operable to provide a first signal in a frequency band centered at a first frequency f1; an output network having second and third pairs of terminals and configured to pass, between the second and third pairs of terminals, a second signal in a frequency band centered at a second frequency f2 different from f1; a pump circuit having a fourth pair of terminals and operative to provide, at the fourth pair of terminals, a third signal at a pump frequency fp, where fp?f1 and f2; and a frequency converter having a first port connected to the first terminals, a second port connected to the second terminals and a third port connected to the fourth terminals, the frequency converter being operative to cause the difference between f1 and f2 to be equal to fp.

13 Claims, 6 Drawing Sheets

(51) Int. Cl.
*H03H 7/01* (2006.01)
*H03H 11/12* (2006.01)

(58) Field of Classification Search
USPC .......................... 327/355–361; 455/323, 326
See application file for complete search history.

(56) References Cited

U.S. PATENT DOCUMENTS

| | | | | |
|---|---|---|---|---|
| 5,878,333 | A * | 3/1999 | Kitaguchi | H03B 5/1203 333/223 |
| 5,930,696 | A * | 7/1999 | Tzuang | H03D 7/1441 348/725 |
| 6,160,571 | A * | 12/2000 | Wang | H04B 1/40 348/725 |
| 6,944,431 | B2 * | 9/2005 | Suzuki | H03D 7/161 348/729 |
| 7,369,817 | B2 * | 5/2008 | Takikawa | H01L 23/50 257/E23.079 |
| 7,423,699 | B2 * | 9/2008 | Vorenkamp | H01F 17/0006 257/E27.046 |
| 8,014,466 | B2 * | 9/2011 | Min | H04L 27/12 331/45 |

FOREIGN PATENT DOCUMENTS

| | | |
|---|---|---|
| RU | 2453988 C1 | 6/2012 |
| SU | 119551 A1 | 11/1958 |
| SU | 187097 A1 | 11/1966 |
| SU | 1008882 A1 | 3/1983 |

OTHER PUBLICATIONS

Search Report and Written Opinion; Article 19 Aug. 27, 2013; Written Opinion Jul. 13, 2014.

* cited by examiner

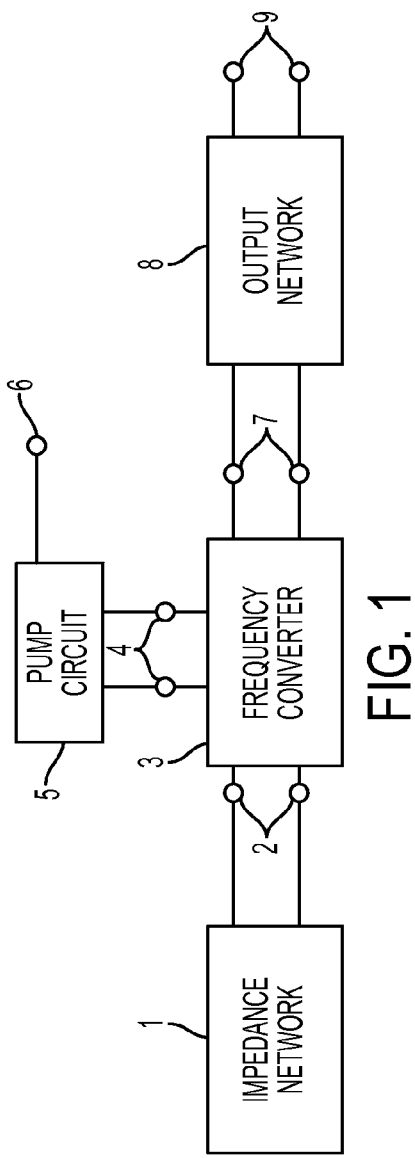
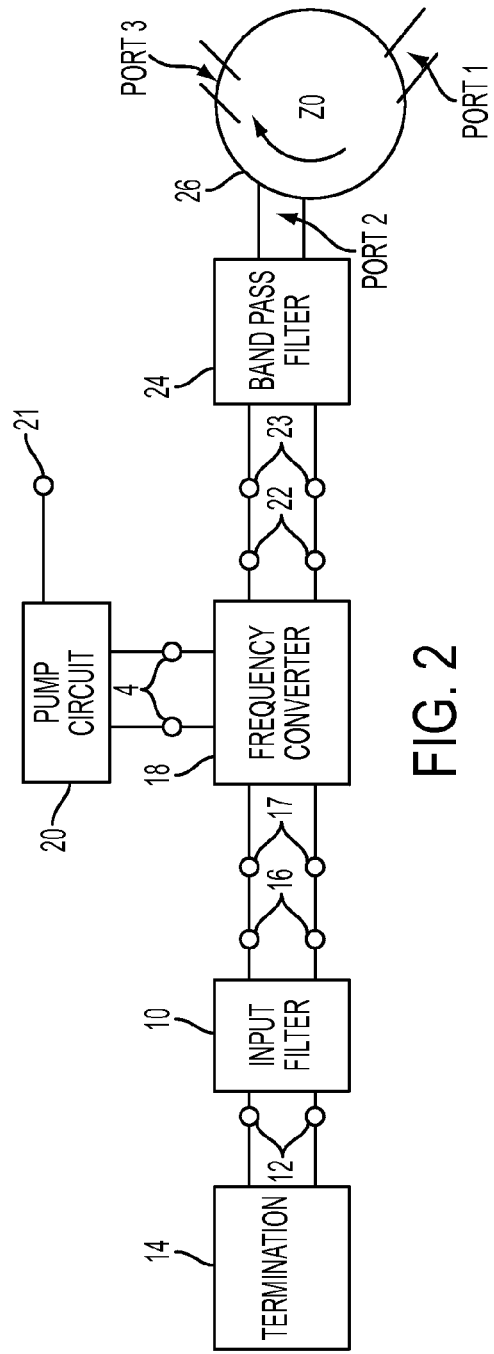

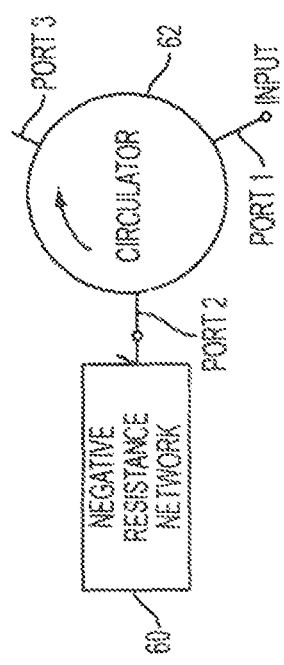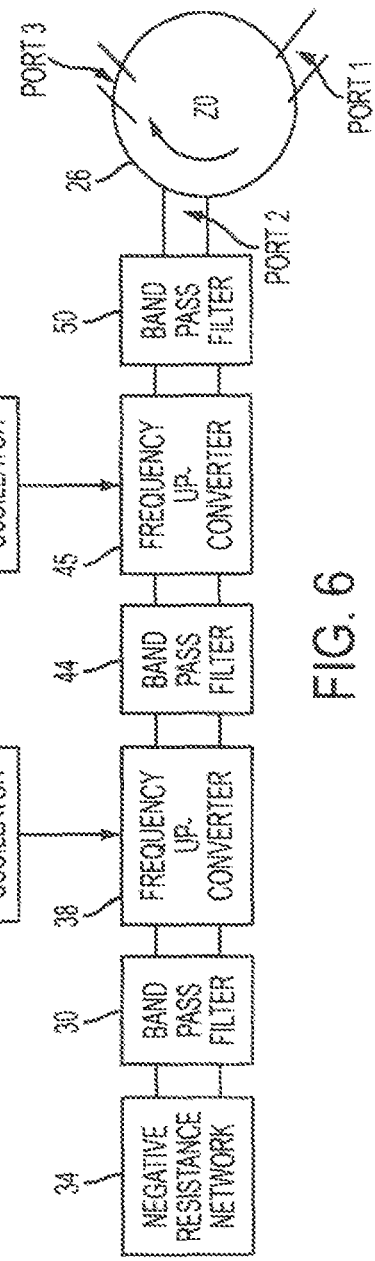

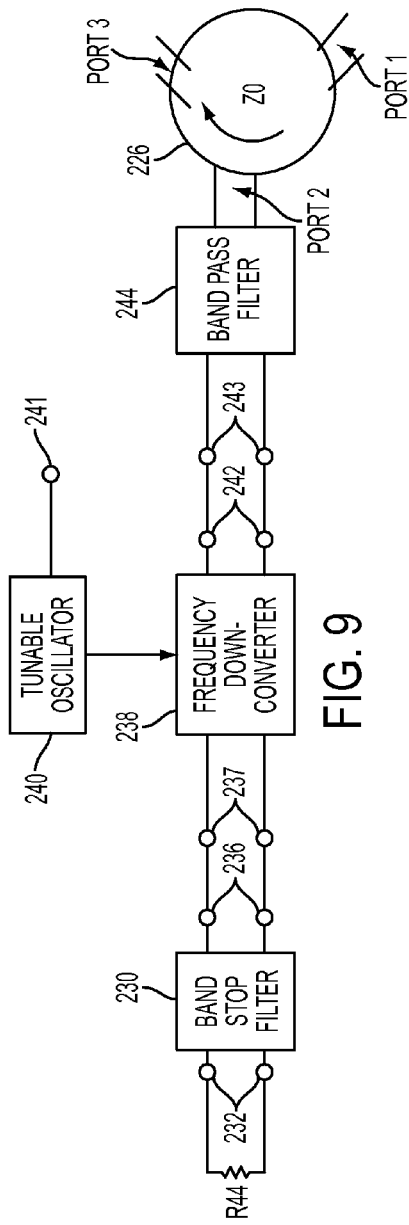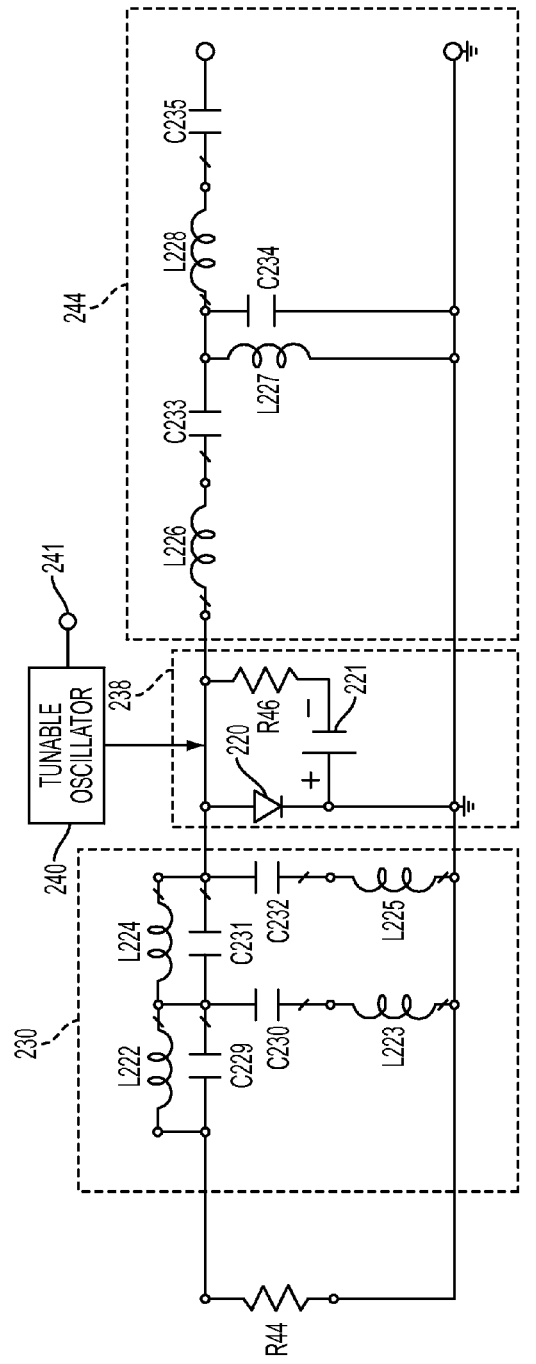

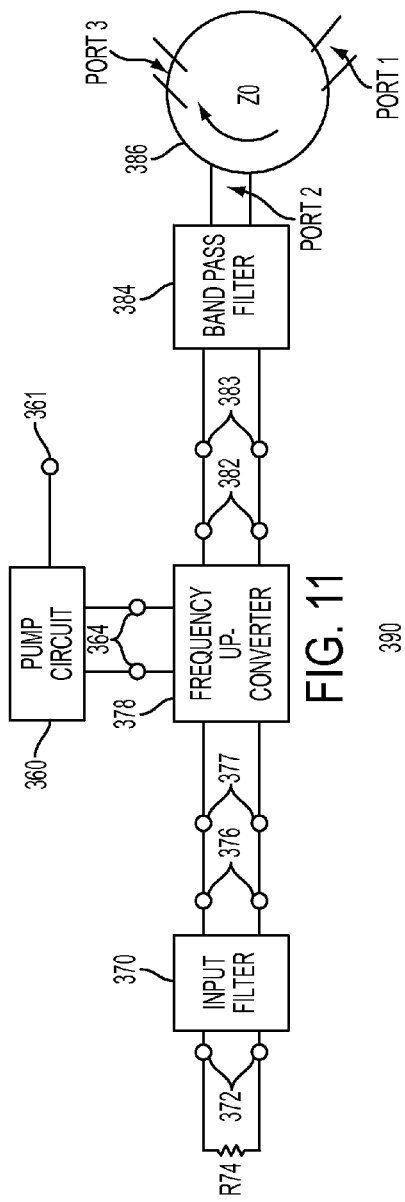
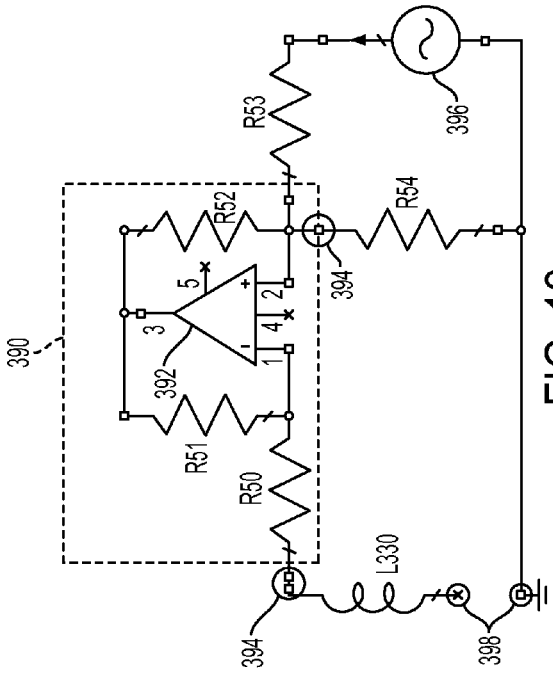
FIG. 11
FIG. 12

CIRCUIT CONFIGURATION USING A FREQUENCY CONVERTER TO ACHIEVE TUNABLE CIRCUIT COMPONENTS SUCH AS FILTERS AND AMPLIFIERS

BACKGROUND OF THE INVENTION

My present invention relates to a circuit configuration that can be used to realize tunable components such as but not limited to, bandstop filters, bandpass filters and negative resistance amplifiers that are capable of having very narrow bandwidths or very wide bandwidths depending on the configuration. It should be understood that a filter with a percent bandwidth of less than about 15% is considered narrow band and that a filter with a percent bandwidth of less than about 5% is considered very narrow bandband. Thus a filter with a 20 MHz. bandwidth centered at 100 MHz is not narrow band but a filter with a 20 MHz bandwidth centered at 1 GHz is very narrow band. The use of the term narrow band or wide band when used will refer to the percent bandwidth.

There are already known circuits where the tuning method involves changing the capacitance of resonators by either using voltage variable capacitors or by the use of switching matrices that switch different capacitors into the circuit.

BRIEF SUMMARY OF THE INVENTION

Circuits according to this invention offer advantages over known circuits, including: preserving bandwidth over the tuning range without elaborate compensation technique; preserving the passband and/or stopband characteristics without elaborate compensation techniques, and achieving much narrower bandwidths than with known circuits of comparable size.

Circuit configurations according to the invention utilize one or more frequency converters, either frequency up-converters or down-converters. The use of frequency up-converters enables the circuit to have a much narrower bandwidth than is achievable by circuits of comparable size. The use of frequency down-converters enables the realized component to have a very wide tunable bandwidth. The use of frequency converters in the circuit configuration enables the circuit to be tuned by varying the pump frequency of the frequency converter(s), while preserving the component characteristics and bandwidth.

BRIEF DESCRIPTION OF THE DRAWINGS

FIG. 1 is a block diagram showing the basic components of the present invention.

FIG. 2 is a block diagram of an embodiment of the present invention, which can be a negative resistance amplifier, a bandstop filter or a bandpass filter.

FIG. 5 is a circuit diagram of an embodiment of my invention as a negative resistance amplifier according to the invention coupled to a three-port circulator FIG. 6 is a block diagram of an embodiment of the negative resistance amplifier using a cascade of two frequency up-converters coupled to a circulator and a negative resistance network.

FIG. 9 shows an embodiment of the present invention as a wideband tunable bandpass filter.

FIG. 10 is a more detailed circuit diagram of the embodiment of FIG. 9.

FIG. 11 shows an embodiment of the present invention as a narrowband tunable bandstop or bandpass filter.

FIG. 12 is a circuit diagram of one embodiment of a component of circuits according to the present invention.

DETAILED DESCRIPTION OF THE INVENTION

Figure 3:
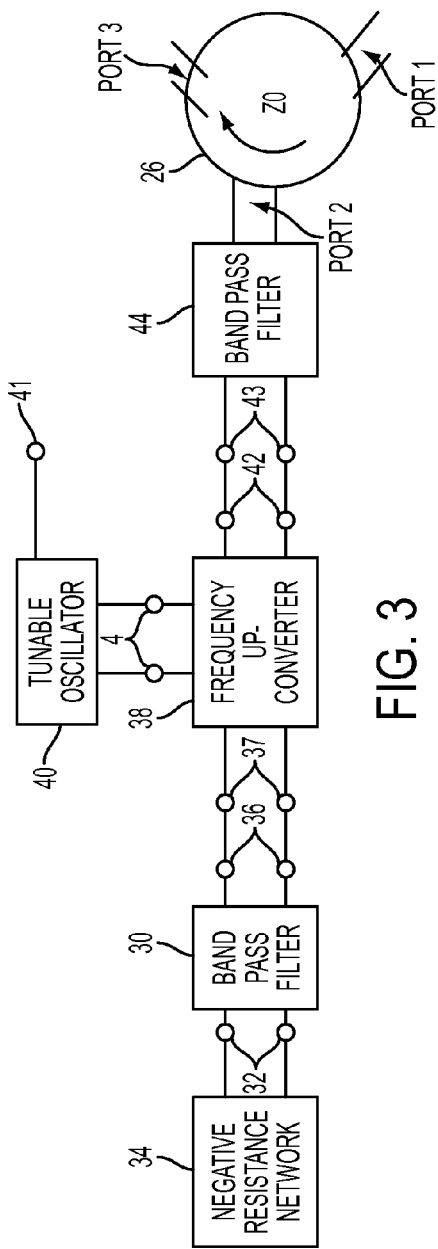
FIG. 3 is a block diagram of an embodiment of the present invention constituting a negative resistance amplifier.

FIG. 1 shows in block diagram form the basic components of a circuit according to the invention including an impedance network 1 constituting a termination of the circuit and having one port 2, a frequency converter 3 having three ports, a pump circuit 5 and an output network 8.

A port 2 connects impedance network 1 to frequency converter 3 and passes frequencies in a band centered at a frequency f1, a port 4 connects frequency converter 3 to pump circuit 5 and passes frequencies in a band centered at a frequency fp, and a port 7 connects frequency converter 3 to output network 8 and passes frequencies in a band centered at a frequency f2. If frequency converter 3 is an up-converter then $f2=f1+fp$ and f2 is greater than f1. If frequency converter 3 is a down-converter then $f1=f2+fp$ and f1 is greater than f2. Pump circuit 5 provides the necessary current to frequency converter 3, at frequency fp. It may supply power to frequency converter 3 at frequency fp, or may dissipate power at that frequency, depending on the whether the frequency converter is an up-converter or down-converter and whether the circuit is a negative resistance amplifier or a filter. The pump circuit 5 can have the ability to vary the frequency fp, which will tune the circuit. For the case of a tunable circuit, fp will lie in the frequency range from fp1 to fp2 and a control signal applied to the pump circuit at control port 6 will be able to set the frequency to any frequency in that frequency range. It may also be able to control the level of the current provided to frequency converter 3, at frequency fp. Port 7 of frequency converter 3 is coupled by output network 8 to output terminal 9.

The Manley Rowe equations (Manley J. M., and H. E. Rowe Some General Properties of Nonlinear Elements Part 1 Proc. IRE 44 904-913 July '56) states that for a frequency up-converter $P1/f1=Pp/fp=-P2/f2$, where P1 is the power into the frequency up-converter at frequency f1, Pp is the power into the frequency up-converter at frequency fp and P2 is the power into the frequency up-converter at frequency f2, Thus if power goes into the frequency up-converter at frequency f2 then P2 is positive and power must be delivered to the circuits terminating the frequency up-converter at frequencies f1 and fp. Conversely if power is delivered to the circuits terminating the frequency up-converter at frequency f2, then power must be supplied to the frequency up-converter at frequencies f1 and fp.

The Manley Rowe equations (Manley J. M., and H. E. Rowe Some General Properties of Nonlinear Elements Part 1 Proc. IRE 44 904-913 July 56) state that for a frequency down-converter $P2/f2=Pp/fp=-P1/f1$. Thus, if power is delivered to the circuits terminating the down-converter at frequency f1, then power must be supplied to the frequency down-converter at frequencies f2 and fp.

The frequency converter 3 may be comprised of passive and active linear circuit elements and one or more known circuit elements, each being characterized by a non-linear relationship between the voltage across that element and either the charge stored by that element, which is thus a capacitive reactance, or the magnetic flux produced by the current passing through that element, which is thus an inductive reactance. The frequency converter 3 has a circuit element, or elements, for biasing the non-linear elements. The frequency converter 3, when pumped at frequency fp by pump circuit 5, should be responsive to a signal at its input port 2 at a frequency f1 where f1 lies in the frequency range from fa to fb. The frequency converter 3 will then image the output impedance of the impedance network 1, at the output 7 of the frequency converter 3, over the frequency range from fp+fa to fp+fb.

A circuit having the form shown in FIG. 1 operates as follows:

It is known from the prior art that a frequency converter can image an impedance at frequency f1, connected to its input terminal, to an impedance at frequency fp+f1 at its output terminal, where fp is the pump frequency. A property of the imaging is that the bandwidth of the passband or stop band of network 1 will be the same as the bandwidth of the passband or stop band of network 8. The frequency converter 3 in FIG. 1 images the impedance presented to it at its input terminal 2 at frequency f1 at the output port 7 of the frequency converter 3, at frequency fp+f1, while preserving the bandwidth of the impedance. By suitable choices of the impedance network 1, the parameters of the frequency up-converter 3 and of the output network 8, the impedance realized at the output terminal 9 can be designed to be of such a form that, in conjunction with a circulator or other circuitry, will produce the desired circuit component. In the case of a frequency up-converter, the circuit can have a very narrow tunable bandwidth. In the case of a frequency down-converter the circuit can have a very wide tunable bandwidth.

FIG. 2 shows an embodiment of the invention, which can be used to realize tunable narrow-band, negative resistance amplifiers, bandstop filters and bandpass filters. For this embodiment, a termination 14 is connected to the input port 12 of an input filter 10, which has a bandwidth from fa to fb. The output port 16 of filter 10 is connected to input port 17 of a frequency converter 18. Filter network 10, connected to input termination 14, corresponds to the impedance network 1 of FIG. 1. The frequency converter 18 is pumped at a frequency fp by means of a tunable pump circuit 20, where fp lies between fp1 and fp2. A control signal applied at the pump circuit control port 21 can tune pump circuit 20 to any frequency in the frequency range from fp1 to fp2 and may also be able to control the level of the current provided to frequency converter 18 at frequency fp. The output terminal 22 of the frequency converter 18 is coupled to a circulator 26, via a bandpass filter 24. Bandpass filter 24 corresponds to the output network 8 shown in FIG. 1. It therefore follows that the circuit shown in FIG. 2 is one example of the circuit configuration shown in FIG. 1, connected to a circulator.

Bandpass filter 24 has a passband that covers the frequency range from fp+fa to fp+fb, where fp lies in the frequency range from fp1 to fp2. It can be any known type of bandpass filter which has the property that signals at frequencies between fp1+fa and fp2+fb are coupled between the output terminal 22 of the frequency up-converter 18 and port 2 of circulator 26. Furthermore, for optimum operation, filter 24 may include a circuit element, or elements, for impedance matching the frequency converter 18 to the circulator 26 in order to optimize performance.

Circulator 26 has at least three ports. For a three port circulator, a substantially unidirectional signal path is provided between a first (or input) port 1 and a second (or intermediate) port 2, and between the second port 2 and a third (or output) port 3. When a signal with power P0 is applied to port 1 of the circulator and port 2 is terminated in an impedance Z2, the power at port 3 of the circulator is equal to P0 times the magnitude squared of the reflection coefficient at port 2, which is equal to $(|(Z0-Z2)/(Z0+Z2)|)^2$, where Z0 is the characteristic impedance of the circulator. If, at the frequency of the input signal, port 2 is terminated in a negative resistance, the reflection coefficient at that port is greater than unity and accordingly, the power delivered to port 3 is greater than the power applied at port 1. Thus, there is a power gain at port 3 with respect to port 1. If, at the frequency of the input signal, Z2 is purely reactive, that is the real part is zero, then the reflection coefficient at port 2 is equal to unity. If Z2=Z0 the reflection coefficient equals zero and no power is delivered to port 3.

FIG. 3 shows a more specific embodiment of the present invention as a negative resistance amplifier in block diagram form. In FIG. 3, filter 10 of FIG. 2 is a bandpass filter 30, termination 14 of FIG. 2 is a negative resistance network 34, frequency converter 18 of FIG. 2 is a frequency up-converter 38. The pump circuit 20 of FIG. 2 is a tunable oscillator 40 in this embodiment since for a negative resistance amplifier the up-converter delivers power at f2. It can be seen from the Manley Rowe equations that power is delivered to the frequency up-converter at f1 and fp.

The negative resistance network 34 may be any known network characterized by a negative ratio of voltage across the network's output port to the current into the network's output port over a frequency range that extends between fa and fb. Such networks can be realized using tunnel diodes, Gunn diodes, or operational amplifiers, inter alia. Bandpass filter 30 has a passband from fa to fb, with center frequency $f_1$. This bandpass filter has elements for impedance matching the negative resistance network 34 to the frequency up-converter 38, over the frequency range fa to fb. Bandpass filter 30 provides, at the input terminals 37 of frequency up-converter 38, an effective negative resistance over this frequencies range.

It is known from the prior art (see, one example of which is disclosed in U.S. Pat. No. 3,588,727, issued to Harold Seidel on Jun. 28, 1971, the disclosure of which is incorporated herein by reference.) that a frequency up-converter can image an impedance a frequency f1 connected to its input terminal to an impedance at frequency fp+f1 at its output terminal, where fp is the pump frequency of the frequency up-converter. The frequency up-converter 38, in FIG. 3 images the negative impedance presented at its input terminal 37, at frequency f1, at its output terminals 42, at frequency fp+f1. Bandpass filter 44 couples this negative resistance to port 2 of circulator 26. The negative resistance network 34 of FIG. 3 is an operational amplifier circuit (see, for example, http://en.wikipedia.org/wiki/Negative_impedance_converter).

Figure 4:
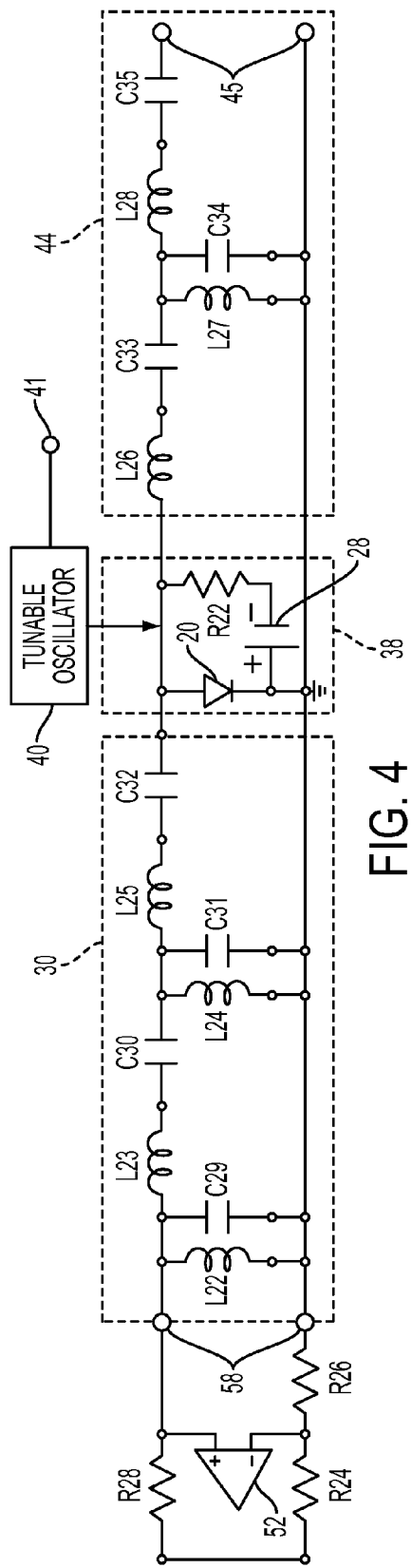
FIG. 4 is a more detailed circuit diagram of an embodiment of my invention as a negative resistance amplifier.

FIG. 4 shows a detailed circuit implementation of a preferred embodiment of a negative resistance amplifier according to the invention.

The circuit of FIG. 4 is composed of an operational amplifier 52, one example of which is an operational amplifier marketed by Analog Devices as model number ADA4817-1, and three resistors R24, R26 and R28 whose values are given in table 1. A negative resistance of 50 ohms appears at terminals 58; the input terminals of bandpass filter 30. Bandpass filter 30 provides at the input to frequency up-converter 38 an effective negative resistance at frequencies from approximately 97.5 MHz to 102.5 MHz, i.e., by way of example. Outside of this band the impedance provided is reactive. Bandpass filter 30 includes radio frequency coils L22-L25 and variable capacitors C29-C32. The coils L22-25 have values selected to resonate at 100 MHz with their respective capacitors C29-C32 when the capacitances of the capacitors are approximately in the center of their variable range. These four resonators thus comprise the filter 30, which passes signals from 97.5 MHz to 102.5 MHz and rejects frequencies outside of this band. Using well-known techniques, the capacitances of the capacitors may be varied to match input network 30 to the frequency up-converter 38.

The frequency up-converter 38 is comprised of a 5 pf varactor diode 20 for this exemplary case, biased by a 300 ohm resistor R22 and a 6 volt dc battery 21. A varactor is a non-linear capacitor whose capacitance is a function of the voltage across it. The varactor is "pumped" at a frequency range of 900 MHz±50 MHz for this exemplary case by a digitally controlled oscillator 40, which is a well known and commercially available component.

Output network 44 is a bandpass filter, with a passband from 950 MHz to 1050 MHz. Bandpass filter 44 includes radio frequency coils L26-L28 and variable capacitors C33-C35. The coils L26-L28 have values selected to resonate at 1.0 GHz with their respective capacitors C33-C35 when the capacitances of the capacitors are approximately in the center of their variable range. These three resonators thus comprise filter 44, which passes frequencies from 950 MHz to 1050 MHz and rejects frequencies outside of this band. Using well known techniques, the capacitances of the capacitors may be varied to adjust the impedance level presented at the output port 45. Exemplary values for coils L22-L28 (in nanohenries), capacitors C29-C35 (in picofarads) and resistor R22, R24, R26 and R228 (in ohms) are given in table 1 below.

TABLE 1

| | |
|---|---|
| L22 | 1218 nh |
| L23 | 2 nh |
| L24 | 2940 nh |
| L25 | 5 nh |
| L26 | 72 nh |
| L27 | .43 nh |
| L28 | 72 nh |
| C29 | 2 pf |
| C30 | 1176 pf |
| C31 | .9 pf |
| C32 | 487 pf |
| C33 | .35 pf |
| C34 | 58 pf |
| C35 | .35 pf |
| R22 | 300 ohms |
| R24 | 100 ohms |
| R26 | 100 ohms |
| R28 | 50 ohms |

It is well known from the prior art that an amplifier may be configured from a network characterized by a negative resistance over a band of frequencies and a further suitable component or network. One such well known component is a circulator having at least three ports wherein a substantially unidirectional signal path is provided between a first (or input) port and a second (or intermediate) port and between the second port and a third (or output) port. Using such a circulator, by terminating the second port (port 2) with a negative resistance network, such as described above, and applying an input signal to the first port (port 1), the following result occurs: power entering port 1 of the circulator is coupled to port 2 where it is reflected to the output port (port 3). With port 2 being terminated in a negative resistance network, the reflection coefficient at that port is greater than unity and accordingly the power delivered to port 3 is greater than the power applied to port 1 Thus, there is a power gain at port 3 with respect to the signal applied to port 1. Terminating the second port (port 2) with a reactive network i.e., the real part of the impedance is zero and applying an input signal to the first port (port 1), the following result occurs: power entering port 1 of the circulator is coupled to port 2 where it is reflected to the output port (port 3). With port 2 being terminated in a reactive network, the reflection coefficient at that port is equal to unity and accordingly the power delivered to port 3 is equal to the power applied to port 1.

FIG. 5 shows in schematic form such a negative resistance amplifier circuit composed of a three port circulator 62 and a negative resistance network 60, which can have the form shown in FIG. 3 or 4.

The negative resistance amplifier shown in FIG. 5, when negative resistance network 60 is constituted by the negative resistance network of FIG. 4, works as follows:

A negative resistance is presented to the input of the frequency up-converter 38 over the frequency range from 97.5 MHz to 102.5 MHz. Outside of this frequency range the impedance presented to the input of the frequency up-converter 38 has a real part, which is approximately equal to zero. The frequency converter 38 in FIG. 4 images the impedance presented to it at its input terminal, and therefore presents a negative resistance at the input terminal of bandpass filter 44, for frequencies in the frequency range from fp+97.5 MHz to fp+102.5 MHz. Outside of this frequency range the impedance presented to the input terminal of the bandpass filter 44, is a reactance i.e., its real part is approximately equal to zero. Bandpass filter 44 couples this impedance to port 2 of circulator 62. Circulator 62 is thus terminated in a negative resistance at port 2 over the frequency range from fp+97.5 MHz to fp+102.5 MHz and in a reactance outside of this range. Thus, in accordance with the discussion above of the properties of a circulator, the circuit of FIG. 5 will operate as a negative resistance amplifier over the frequency band from fp+97.5 MHz to fp+102.5 MHz. Outside of this frequency band the reflection coefficient at port 2 of the circulator will be equal to unity and there will be no gain. The gain of the amplifier is dependent upon the power level of the pump circuit and can be set to a desired value by adjusting the output power of oscillator 40.

For the circuit of FIG. 4, tuning is accomplished by varying fp by means of a control signal at the oscillator control port 41, over the frequency range from 850 MHz to 950 MHz. The center frequency of the amplifier can thus be tuned over the frequency range from 950 MHz to 1050 MHz.

The percent bandwidth of input network 30 is given by 100×(5/100)=5% while the percent bandwidth of the negative resistance amplifier described above is given by 100×(5/1000)=0.5%. Thus for the exemplary case the percent bandwidth of the input network 30, is 5% and the percent bandwidth of the negative resistance amplifier is 0.5%.

FIG. 6 shows an embodiment of the negative resistance amplifier using a cascade of two frequency up-converters 38 and 45 coupled together by bandpass filter 44. The frequency up-converter 38 in FIGS. 4 and 6 images the impedance presented to it at its input terminal and therefore presents a negative impedance at the input terminal of bandpass filter 44, for frequencies in the range 997.5 MHz to 1002.5 MHz for fp=900 MHz for the exemplary case. Outside of this frequency range the impedance presented to the input terminals of the bandpass filter 44, is a reactance i.e., its real part is approximately equal to zero. Bandpass filter 44 couples this negative impedance to frequency up-converter 45 in FIG. 6. If frequency up-converter 45 is pumped at 9 GHz, then the negative resistance will be coupled to port 2 of circulator 26 at a center frequency of 10 GHz. The bandwidth of the negative resistance amplifier will be 5 MHz and hence the percent bandwidth will be 0.05%.

Figure 7:
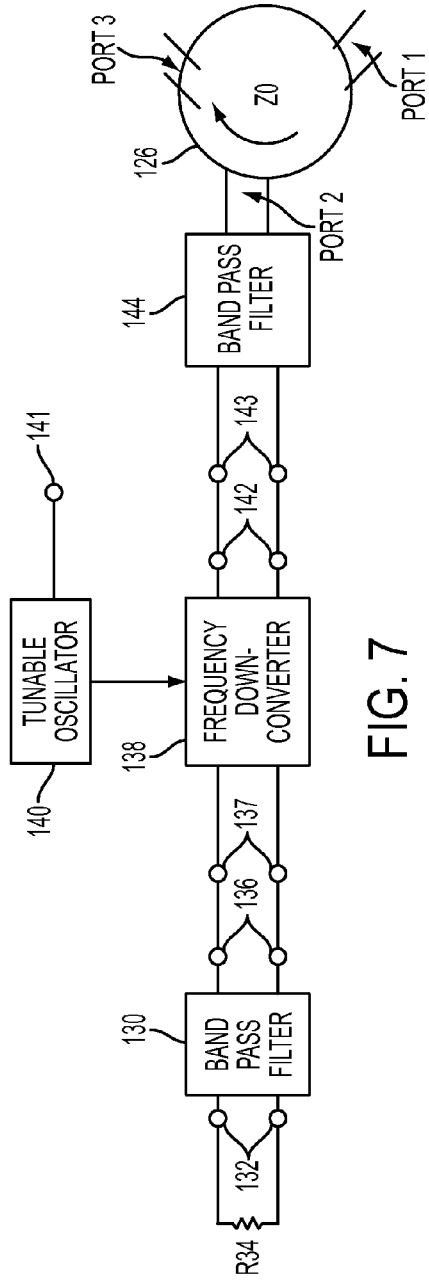
FIG. 7 is a block diagram of an embodiment of the present invention as a bandstop filter

FIG. 7 shows an embodiment of the present invention as a bandstop filter in block diagram form with a stop band from fa to fb. In FIG. 7, the filter 10 in FIG. 2 is in the form of a bandpass filter 130, the termination 14 in FIG. 2 is a resistor R34 having a resistance value equal to the characteristic impedance of filter 130, the frequency converter 18 in FIG. 2 is a frequency down-converter 138, the pump circuit 20 in FIG. 2 is a tunable oscillator 140. In the embodiment of FIG. 7, for a bandstop filter, when f1>fp and when the down-converter receives power at frequencies f2 and fp, it can be seen from the Manley Rowe equations that power is delivered to the frequency down-converter at frequency f1. Bandpass filter 130 provides, at the input terminals 137 of frequency down-converter 138, a resistance of 50 ohms over its bandwidth.

It is known from the prior art that a frequency down-converter can image an impedance at frequency f1 connected to its input terminal, to an impedance at frequency |f1−fp| at its output terminal, where fp is the pump frequency of the frequency down-converter. The frequency down-converter 138 in FIG. 7 images the impedance presented to it at its input terminal 137 at frequency f1, at its output terminals 142, at frequency f1−fp. The frequency down-converter can be designed to present an impedance of Z0 ohms, over the frequency range from fp−fa to fp−fb, where Z0 is the characteristic impedance of the circulator 126. Bandpass filter 44 couples this resistance to port 2 of circulator 126.

Figure 8:
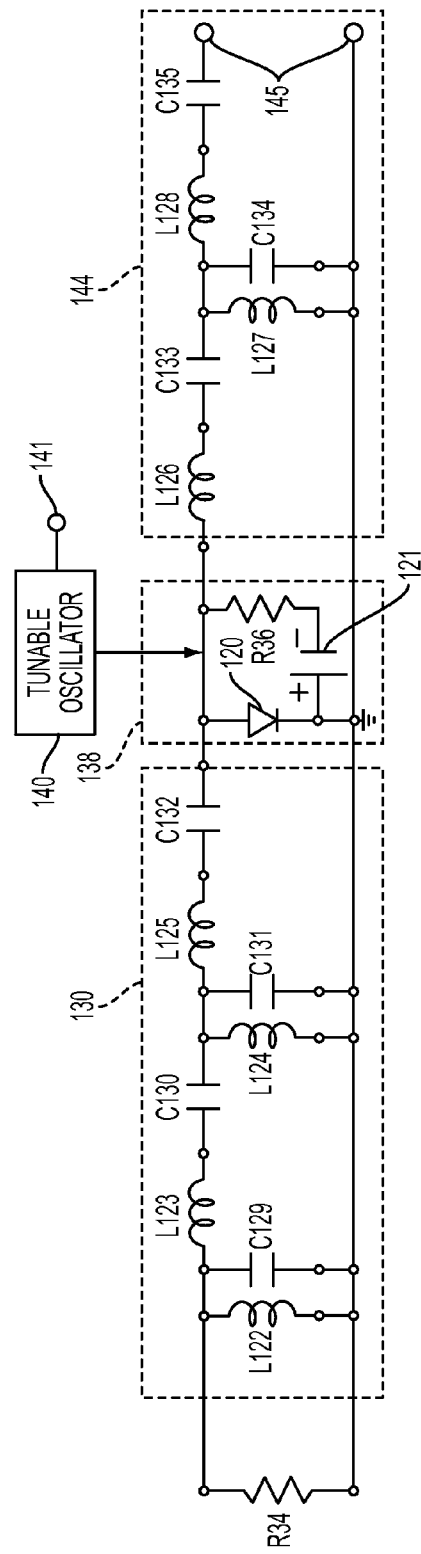
FIG. 8 is a more detailed circuit diagram of the embodiment of FIG. 7.

FIG. 8 shows a more detailed circuit diagram of the embodiment of FIG. 7. In this embodiment, a resistance R34 of 50 ohms appears at the input terminals of bandpass filter 130. Bandpass filter 130 provides at the input to frequency downconverter 138 a resistance of 50 ohms at frequencies from approximately 810 MHz to 990 MHz, i.e. the exemplary case. Outside of this band, the impedance provided is reactive. Bandpass filter 130 includes radio frequency coils L122-L125 and variable capacitors C129-C132. The coils L122-L125 have values selected to resonate at 900 MHz with their respective capacitors C129-C132 when the capacitors are approximately in the center of their variable range. These four resonators thus comprise a filter that passes signals from 810 MHz to 990 MHz and rejects frequencies outside of this band. Using well-known techniques the capacitors may be varied to match input network 130 to the frequency down-converter 138.

The frequency down-converter 138 is comprised of a 5 pf varactor diode 120 for this exemplary case, biased by a 300 ohm resistor R36 and a 6 volt dc battery 121. (A varactor is a non-linear capacitor whose capacitance is a function of the voltage across it.)

The varactor is "pumped" at a frequency from 550 MHz to 605 MHz for this exemplary case by a digitally controlled oscillator 140, which is a well known and commercially available component.

Output network 144 is a bandpass filter, with a passband from 205 MHz to 440 MHz. Bandpass filter 144 includes radio frequency coils L126-L128 and variable capacitors C133-C135. The coils L126-L128 have values selected to resonate at 322.5 MHz with their respective capacitors C133-C135 when the capacitors are approximately in the center of their variable range. These three resonators thus comprise a filter, which passes frequencies from 205 MHz to 440 MHz and rejects frequencies outside of this band.

Using well known techniques, the capacitors may be varied to adjust the impedance level presented at the output port 145. Exemplary values for coils L122-L128 (in nanohenries), capacitors C129-C135 (in picofarads) and resistor R34 and R36 (in ohms) are given in table 2 below.

TABLE 2

| L123 | .95 nh |
|---|---|
| L124 | 81.7 nh |
| L125 | 2.31 nh |
| L126 | 33.15 nh |
| L127 | 10.6 nh |
| L128 | 33.15 nh |
| C129 | .92 pf |
| C130 | 32.7 pf |
| C131 | .38 pf |
| C132 | .13.5 pf |
| C133 | 8.5 pf |
| C134 | 26.5 pf |
| C135 | 8.5 pf |
| R34 | 50 ohms |
| R36 | 300 ohms |

The bandstop filter shown in FIGS. 7 and 8 works as follows: If the output impedance of bandpass filter 144, which is presented to port 2 of the circulator 126, is approximately equal to Z0 over the frequency range from fp+fa to fp+fb and has a real part approximately equal to zero outside of this frequency range, the circuit of FIGS. 7 and 8 will be a bandstop filter passing all frequencies except in the frequency range from fp+fa to fp+fb.

Filter network 130 presents to the input of frequency downconverter 138, at its input port 137, an impedance which is approximately equal to a constant resistance over the frequency range from fa to fb and whose real part is approximately equal to zero outside of this frequency range. By suitable choice of the parameters of the frequency down-converter 138 and filter network 144, the impedance presented at the output of filter network 144 can be made approximately equal to Z0 over the frequency range from fp+fa to fp+fb and have a real part approximately equal to zero outside of this range. Thus, in accordance with the discussion above relating to FIGS. 7 and 8, the circuit of FIGS. 7 and 8 will operate as a bandstop filter, rejecting frequencies in the frequency range from fp+fa to fp+fb. In the example shown in FIG. 8, fa equals 810 MHz and fb equals 990 MHz. Fp can be tuned from 550 MHz to 605 MHz. The bandstop filter has a bandwidth of 180 MHz and its center frequency can be tuned from 295 MHz to 350 MHz.

The percent bandwidth of bandpass filter 130 is given by 100×(fa−fb)/f1, while the percent bandwidth of the bandstop filter of FIG. 7 is given by 100×(fa−fb)/(fp+f1). The ratio of the percent bandwidths is thus f1/(fp+f1). For the circuit of FIG. 8, the percent bandwidth of filter network 130 is 20% and for a pump frequency fp=600 MHz, the percent bandwidth of the bandstop filter of FIG. 7 is 60%.

FIG. 9 shows an embodiment of the present invention as a wideband tunable bandpass filter in block diagram form.

The filter only works as a bandpass filter over the passband of bandpass filter 244. Outside of this passband the impedance is reactive and all of the power is reflected from port 1 of circulator 226 to port 3. The filter 10 in FIG. 2 is a bandpass filter 230, with a stopband in the frequency range from fa to fb, the termination 14 in FIG. 2 is a resistor R44 of value equal to the characteristic impedance of the bandstop filter 230, the frequency converter 18 in FIG. 2 is a frequency down-converter 238, the pump circuit 20 in FIG. 2 is a tunable oscillator 240 since, for a bandpass filter, the down-converter receives power at frequency f2 and it is seen from the Manley Rowe equations that power is delivered to the frequency down-converter at frequency fp. Bandstop filter 230 provides to the down-converter 238 a resistance equal to its characteristic impedance, except in the frequency range from fa to fb and outside of the bandwidth of bandpass filter 230.

It is known from the prior art that a frequency down-converter can image an impedance at frequency f1, connected to its input terminal, to an impedance at frequency f1−fp at its output terminal, where fp is the pump frequency of the frequency down-converter. The frequency down-converter 238 in FIG. 9 images, at frequency f1−fp at its output terminals 242, the resistance presented to its input terminals 237 at frequency f1. The frequency down-converter can be designed to present a real impedance of Z0 ohms at port 2 of circulator 226 except in the frequency range from fa−fp to fb−fp and outside of the bandwidth of bandpass filter 244, where Z0 is the characteristic impedance of the circulator 226.

FIG. 10 shows a more detailed circuit diagram of the embodiment of FIG. 9. A resistance of 50 ohms appears at the input terminals of bandstop filter 230. Bandstop filter 230 provides at the input to frequency down converter 238 a resistance of 50 ohms, except at frequencies from approximately 810 MHz to 990 MHz, i.e. the exemplary case. Inside of this frequency band, the impedance provided is reactive. Bandstop filter 230 includes radio frequency coils L222-L225 and variable capacitors C229-C232. The coils L222-L225 have values selected to resonate at 900 MHz with their respective capacitors C229-C232 when the capacitors are approximately in the center of their variable range. These four resonators thus comprise a filter, which rejects signals from 810 MHz to 990 MHz and passes frequencies outside of this band. Using well-known techniques, the capacitors may be varied to match input network 230 to the frequency down-converter 238.

The frequency down-converter 238 is comprised of a 5 pf varactor diode 220 for this exemplary case, biased by a 300 ohm resistor R46 and a 6 volt dc battery 221. (A varactor is a non-linear capacitor whose capacitance is a function of the voltage across it.) The varactor is "pumped" at a frequency from 550 MHz to 605 MHz for this exemplary case by a digitally controlled oscillator 240, which is a well known and commercially available component.

Output network 244 is a bandpass filter, with a passband from 205 MHz to 440 MHz. Bandpass filter 244 includes radio frequency coils L226-L228 and variable capacitors C233-C235. The coils L226-L228 have values selected to resonate at 300 MHz with their respective capacitors C233-C235 when the capacitors are approximately in the center of their variable range. These three resonators thus comprise a filter, which passes frequencies from 205 MHz to 440 MHz and rejects frequencies outside of this band. Using well known techniques, the capacitors may be varied to adjust the impedance level presented at the output port 245. Exemplary values for coils L222-L228 (in nanohenries), capacitors C229-C235 (in picofarads) and resistors R44 and R46 (in ohms) are given in Table 3 below.

TABLE 3

| | |
|---|---|
| L223 | 39.0 nh |
| L224 | 4.1 nh |
| L225 | 34.2 nh |
| L226 | 26.5 nh |
| L227 | 13.3 nh |
| L228 | 26.5 nh |
| C229 | 46.2 pf |
| C230 | .67 pf |
| C231 | 8.1 pf |
| C232 | .97 pf |
| C233 | 10.6 pf |
| C234 | 21.2 pf |
| C235 | 10.6 pf |
| R44 | 50 ohms |
| R46 | 300 ohms |

*The bandstop filter shown in FIG. 9 works as follows: If the output impedance of bandpass filter 244, shown in FIG. 9, which is presented to port 2 of the circulator 226 is approximately equal to Z0 outside of the frequency range from fa−fp to fb−fp, but within its passband (outside of its passband the output impedance is reactive) then outside of this frequency range fa−fp to fb−fp but within the passband of bandpass filter 244 the circulator 226 will be perfectly matched at port 2 and no power will flow from port 1 to port 3. If inside of this frequency range the impedance presented to port 2 has a real part approximately equal to zero, then inside of this frequency range the reflection coefficient will be unity and all of the power at port 1 of circulator 226 will appear at port 3 of the circulator. Thus, under these conditions, the circuit of FIG. 9 will be a bandpass filter in the passband of bandpass filter 244 passing all frequencies in the frequency range from fa−fp to fb−fp and rejecting frequencies outside of this range. Filter network 230, shown in FIG. 9, presents to the input of frequency downconverter 238, at its input port 237, an impedance which is approximately equal to a constant resistance outside of the frequency range from fa to fb and whose real part is approximately equal to zero inside of this frequency range. By suitable choice of the parameters of the frequency down-converter 238 and filter network 244, the impedance presented at the output of filter network 244 can be made approximately equal to Z0 outside of the frequency range from fa−fp to fb−fp but within the passband of bandpass filter 244 and have a real part approximately equal to zero inside this range. Thus, in accordance with the discussion above relating to FIG. 9, the circuit of FIG. 9 will operate as a bandpass filter, passing signals in the frequency range from fp+fa to fp+fb. In the example shown in FIG. 10, frequency fa equals 810 MHz and frequency fb equals 990 MHz, and frequency fp can be tuned from 550 to 605 MHz. The bandpass filter has a bandwidth of 180 MHz and its center frequency can be tuned from 205 MHz to 440 MHz.

The percent bandwidth of filter network 230 is given by 100×(fa−fb)/f1 while the percent bandwidth of the bandstop filter is given by 100×(fa−fb)/(fp+f1). The ratio of the percent bandwidths is thus f1/(f1−fp). For the circuit of FIG. 10, the percent bandwidth of filter network 230 is 20% and for a pump frequency fp=600 MHz, the percent bandwidth of the bandpass filter is 60%.

FIG. 11 shows an embodiment of the present invention in block diagram form that can be used as a narrowband tunable bandstop or bandpass filter. As discussed above, when input filter 10 in the circuit of FIG. 2 is a bandpass filter with bandwidth from fa to fb and termination 14 is a resistor whose value equals the characteristic impedance of input filter 10, the circuit of FIG. 2 will act as a bandstop filter, while if the input filter 10 is a bandstop filter with bandwidth from fa to fb and termination 14 is a resistor whose value equals the characteristic impedance of input filter 10, the circuit of FIG. 2 will act as a bandpass filter. This is true whether the frequency converter is an up-converter or a down-converter.

In the circuit of FIG. 11, the input filter 370 may be constituted by the input filter 10 in FIG. 2, the resistor R74 may be constituted by the termination 14 in FIG. 2 and may have a resistance value equal to the characteristic impedance of filter 370 in FIG. 11, and the frequency up-converter 378 may be constituted by frequency converter 18 in FIG. 2. When the frequency converter 18 in FIG. 2 is an up-converter and termination 14 is a resistor, power is delivered to the up-converter at frequency f2. As seen from the Manley Rowe equations, when power is delivered to a frequency up-converter at frequency f2, the input filter must dissipate power at frequency f1 and the pump circuit must dissipate power at frequency fp. The pump circuit 360 of FIG. 11 needs to be a constant current drain so that when connected to port 364 of up-converter 378 current will flow out of the up-converter. This is necessary to satisfy the Manley Rowe equations where power must be delivered to the pump circuit at frequency fp.

An embodiment of pump circuit 360 is shown in FIG. 12. A 50 ohm voltage source, represented by a voltage source 396 with output voltage V and a 50 ohm resistor R53, is shunted by a 45.45 ohm resistor R54. A negative resistance module 390 has an effective resistance of −500 ohms at its output terminals 394. An inductor L330 resonates with the capacitive reactance at the up-converter output terminals 364, due to the average capacitance of the varactor used in up-converter 378. The inductance value of inductor L330 will depend on the pump frequency fp and the specific varactor used. Terminals 398 are arranged in series between inductor L330 and ground. Terminals 398 will be connected to terminals 364 in FIG. 11. The values of the elements in FIG. 12 are given in Table 4, below :

TABLE 4

| | |
|---|---|
| R50 | 100 ohms |
| R51 | 100 ohms |
| R52 | 500 ohms |
| R53 | 50 ohms |
| R54 | 45.45 ohms |

Since the real part of the impedance at terminals 364 of up-converter 378 is very small compared to 500 ohms and the imaginary part has been resonated by inductor L330, the circuit will be a constant current drain. The values in Table 4 were chosen such that the 50 ohm voltage source 396 and R53, is terminated in 50 ohms. Standard circuit analysis of the circuit of FIG. 12 yields a value of the constant current drain of V milliamperes, where V has the same numerical value as the output from voltage source 396 in volts.

Module 390 of FIG. 12 is a standard negative resistance circuit similar to the one used in FIG. 4. Module 390 includes an operational amplifier 392 and three resistors R50, R51 and R52 chosen to yield a negative resistance of −500 ohms. The choice of operational amplifier depends on the pump frequency. The bias circuit for the operational amplifier is not shown and depends on the specific operational amplifier. It will be given on the manufacturer's data sheet for the specific operational amplifier.

It is known from the prior art that a frequency up-converter can image an impedance centered at frequency f1, connected to its input terminal, to an impedance centered at frequency fp+f1 at its output terminal, where fp is the pump frequency of the frequency up-converter. The frequency up-converter 378, in FIG. 11 images the resistance presented to it at its input terminals 377 at frequency f1, at its output terminals 382, at frequency f1+fp. The frequency up-converter can be designed to present an impedance of Z0 ohms in the frequency range from fa to fb for the case where the circuit of FIG. 11 is a bandstop filter and outside of this frequency range for the case where that circuit is a bandpass filter, where Z0 is the characteristic impedance of the circulator 386. Bandpass filter 384 couples this resistance to port 2 of circulator 386.

The filter shown in FIG. 11 is a bandstop filter when input filter 370 is a bandpass filter.

It works as follows: If the output impedance of bandpass filter 384, shown in FIG. 11, which is presented to port 2 of the circulator 386, is approximately equal to Z0 over the frequency range from fp+fa to fp+fb and has a real part approximately equal to zero outside of this frequency range, the circuit of FIG. 11 will be a bandstop filter passing all frequencies except in the frequency range from fp+fa to fp+fb.

When input filter 370, shown in FIG. 11 is a bandpass filter, it presents to the input of frequency up-converter 378, at its input port 377, an impedance which is approximately equal to a constant resistance over the frequency range from fa to fb and whose real part is approximately equal to zero outside of this frequency range. By suitable choice of the parameters of the frequency up-converter 378 and bandpass filter 384, the impedance presented at the output of filter network 384 can be made approximately equal to Z0 over the frequency range from fp+fa to fp+fb and can have a real part approximately equal to zero outside of this range. Thus, the circulator 386 will be perfectly matched over frequency range from fp+fa to fp+fb and in accordance with the discussion above, the circuit of FIG. 11 will operate as a bandstop filter, rejecting signals in the frequency range from fp+fa to fp+fb.

The percent bandwidth of input filter 370 is given by 100×(fa−fb)/f1 while the percent bandwidth of the bandstop filter is given by 100×(fa−fb)/(fp+f1). The ratio of the percent bandwidths is thus f1/(fp+f1). Thus, the bandwidth of the bandstop filter is much smaller than the bandwidth of the input filter 370.

The filter shown in FIG. 11 is a bandpass filter over the passband of bandpass filter 384, as discussed above when input filter 370 is a bandstop filter. It works as follows: If the output impedance of bandpass filter 384, shown in FIG. 11, which is presented to port 2 of the circulator 386, is approximately equal to Z0 outside of the frequency range from fp+fa to fp+fb within the passband of bandpass filter 384 and has a real part approximately equal to zero inside of this frequency range, the circuit of FIG. 11 will be a bandpass filter passing all frequencies in the frequency range from fp+fa to fp+fb and rejecting frequencies outside of this frequency range within the passband of bandpass filter 384.

When input filter 370 shown in FIG. 11 is a bandstop filter, it presents to the input of frequency up-converter 378, at its input port 377, an impedance which is approximately equal to a constant resistance outside of the frequency range from fa to fb, within the passband of bandpass filter 384. and whose real part is approximately equal to zero inside of this frequency range. By a suitable choice of the parameters of the frequency up-converter 378 and bandpass filter 384, the impedance presented at the output of filter network 384 can be made approximately equal to Z0 outside of the frequency range from fp+fa to fp+fb, within the passband of bandpass filter 384. and can have a real part approximately equal to zero inside of this range. Thus, the circulator will be perfectly matched outside of the frequency range from fp+fa to fp+fb and reflect all of the power inside this frequency range. Thus, the circuit of FIG. 11 will operate as a bandpass filter, passing signals in the frequency range from fp+fa to fp+fb and rejecting frequencies outside of this frequency range.

The percent bandwidth of input filter 370 is given by 100×(fa−fb)/f1 while the percent bandwidth of the bandpass filter is given by 100×(fa−fb)/(fp+f1). The ratio of the percent bandwidths is thus f1/(fp+f1). Thus, the bandwidth of the bandpass filter is much smaller than the bandwidth of the input filter 370.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A frequency converting circuit comprising:
   an impedance network having a single pair of terminals and operable to provide an impedance in a frequency band centered at a first frequency f1, said impedance providing a pass band or stop band when said frequency converter circuit is connected to an output component;
   an output network having a second pair of terminals and a third pairs of terminals and configured to pass, between said second and third pairs of terminals, frequencies in a frequency band centered at a second frequency f2, where f2≠f1, the third pair of terminals constituting output terminals connectable to the output component;
   a pump circuit having a fourth pair of terminals and operative to provide power or receive power at said fourth pair of terminals, at a pump frequency fp, where fp≠f1 and f2, and
   a frequency converter selected from the group consisting of an up-converter and a down-converter and having a first port connected to said single pair of terminals, a second port connected to said second pair of terminals and a third port connected to said fourth pair of terminals, said frequency converter comprising at least one nonlinear capacitive or inductive reactance and being operative to cause f1=f2−fp if said frequency converter is said up-converter and f1−|f2−fp| if said frequency converter is said down-convert, wherein said impedance network provides an impedance termination for said frequency converter and said frequency converting circuit is constructed to image the impedance provided by said impedance network at said output terminals.

2. The frequency converter of claim 1, wherein said impedance network comprises a bandpass or bandstop filter.

3. The frequency converter of claim 2, wherein said impedance network further comprises a negative resistance network connected to said filter and constituting a termination of said circuit.

4. The circuit of claim 1, wherein said output network comprises a bandpass filter.

5. The circuit of claim 1, wherein said pump circuit is operative to vary the pump frequency over a frequency band.

6. The circuit of claim 1, wherein said pump circuit is a tunable oscillator.

7. The circuit of claim 1, wherein said frequency converter is an up-converter.

8. The circuit of claim 1, wherein said frequency converter is a down-converter.

9. A combination comprising:
   the circuit of claim 1; and
   the output component connected to said third pair of terminals of said output network.

10. The combination of claim 9, wherein said output component is a three-port circulator.

11. The combination of claim 10, wherein said circulator comprises an input port, an output port and an intermediate port, and said intermediate port is connected to said third pair of terminals of said output network.

12. The circuit of claim 1, wherein said output network comprises, in series between said second pair of terminals and said third pair of terminals, a first bandpass filter, a frequency up-converter and a second bandpass filter, and said circuit further comprises a second pump circuit having an output connected to said frequency up-converter, wherein said second pump circuit produces a signal at a second pump frequency different from the first pump frequency.

13. The circuit of claim 12, wherein each of said pump circuit and second pump circuit is a respective tunable oscillator.

* * * * *